United States Patent [19]

Hayashi et al.

[11] Patent Number: 5,351,209

[45] Date of Patent: Sep. 27, 1994

[54] APPARATUS FOR CONVERTING OPTICAL INFORMATION INTO ELECTRICAL INFORMATION SIGNAL, INFORMATION STORAGE ELEMENT AND METHOD FOR STORING INFORMATION IN THE INFORMATION STORAGE ELEMENT

[75] Inventors: Yutaka Hayashi, Tsukuba; Iwao Hamaguchi, Yamato; Shunsuke Fujita, Kanagawa, all of Japan

[73] Assignees: Ricoh Company, Inc.; Agency of Industrial Science & Technology, both of Tokyo, Japan

[21] Appl. No.: 776,643

[22] Filed: Oct. 15, 1991

Related U.S. Application Data

[62] Division of Ser. No. 503,046, Apr. 2, 1990, Pat. No. 5,079,415.

[30] Foreign Application Priority Data

| Apr. 3, 1989 | [JP] | Japan | 1-84281 |
| Apr. 3, 1989 | [JP] | Japan | 1-84282 |
| Apr. 3, 1989 | [JP] | Japan | 1-84283 |

[51] Int. Cl.⁵ ............................................. G11C 13/04
[52] U.S. Cl. ................................. 365/112; 250/208.1; 365/114
[58] Field of Search ............... 365/112, 113, 114, 118, 365/119, 120; 250/120, 208.1

[56] References Cited

U.S. PATENT DOCUMENTS

| 3,932,025 | 1/1976 | Lakatos et al. | 365/112 |
| 4,778,985 | 10/1988 | Modisette et al. | 365/112 |
| 4,827,117 | 5/1989 | Uchida | 250/208.1 |
| 4,999,484 | 3/1991 | Kaneko | 250/208.1 |

FOREIGN PATENT DOCUMENTS

| 62-139481 | 6/1987 | Japan . |
| 63-34797 | 2/1988 | Japan . |

Primary Examiner—Eugene R. LaRoche
Assistant Examiner—Christopher Glembocki
Attorney, Agent, or Firm—Oblon, Spivak, McClelland, Maier & Neustadt

[57] ABSTRACT

An apparatus for converting optical information into an electrical information signal includes a plurality of one-dimensional conversion arrays arranged in parallel form. Each one-dimensional conversion array has first and second photoelectric conversion structures integrally formed. The first photoelectric conversion structure has photoelectric conversion elements each having a light receiving surface onto which an information light is projected. The second photoelectric conversion structure has photoelectric conversion elements each having a sweep light receiving surface onto which a sweep light is projected. The sweep light has a cross section which simultaneously scans the sweep light receiving surface of one of the photoelectric conversion elements included in each of the one-dimensional conversion arrays. The electrical information signal is read out from the photoelectric conversion elements provided in the first photoelectric conversion structure when the sweep light is projected onto the photoelectric conversion elements provided in the second photoelectric conversion structure.

18 Claims, 8 Drawing Sheets

FIG. 15A
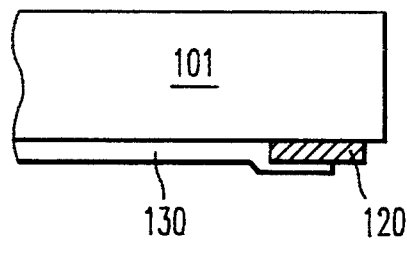
FIG. 15B
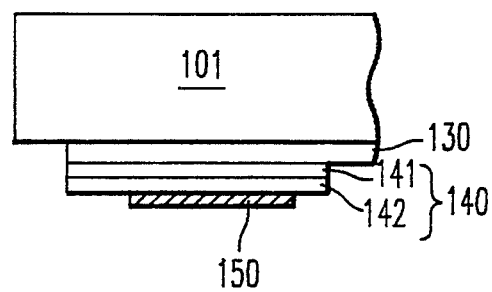
FIG. 15C
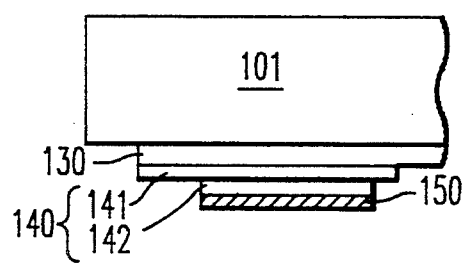
FIG. 15D
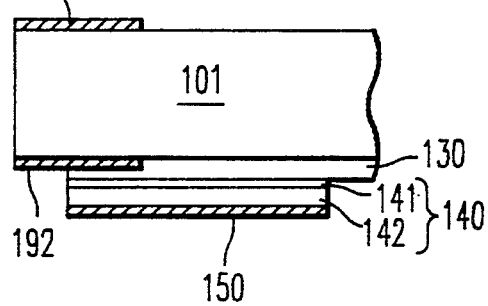
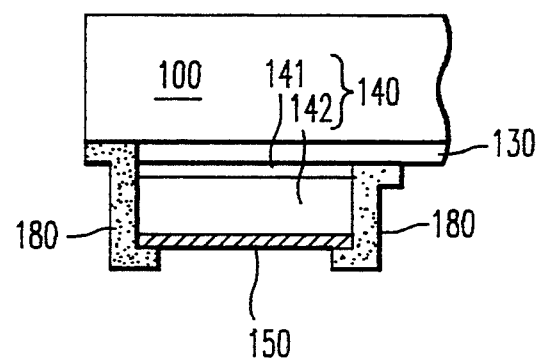
FIG. 15E

APPARATUS FOR CONVERTING OPTICAL INFORMATION INTO ELECTRICAL INFORMATION SIGNAL, INFORMATION STORAGE ELEMENT AND METHOD FOR STORING INFORMATION IN THE INFORMATION STORAGE ELEMENT

This is a division of application Ser. No. 07/503,046, filed on Apr. 2, 1990, now U.S. Pat. No. 5,079,415.

BACKGROUND OF THE INVENTION

The present invention relates to an apparatus for converting optical information into electrical information signal and an information storage element. In addition, the present invention relates to a method for storing information in the information storage element.

One type of apparatus for converting information applied as optical images, into electrical signals, was disclosed in Japanese Laid Open Patent Publication No. 62-139481 as an "Apparatus for converting optical image information into electrical signals". In this conversion apparatus, the optical image information is applied at a signal light receiving surface and is stored in a signal light photo-electrical conversion elements of a photo-electrical conversion portion for signal light.

Then, the information that is stored at each time in each of the signal light photo-electrical conversion elements is read by the scanning of sweep light.

In this manner, the above described conversion apparatus is extremely effective for obtaining electrical signals corresponding to optical information which is stored in each of the areas where the sweep light is irradiated.

In the case of a conventional apparatus for converting optical image information into electrical signals as described above, the scanning by the sweep light is performed either one dimensionally or two dimensionally. The information read is performed by the scanning of the sweep light and so the information read speed is determined by the scan speed of the sweep light. Accordingly, increasing the speed of the information conversion requires that the scan speed of the sweep light be increased but there is a limit to how fast the sweep speed can be made.

In addition, in the above described prior art reference Japanese Laid Open Patent Publication No. 62-139481, the contents of the information that is held at each time by each of the signal light photo-electrical conversion elements in the photoelectric conversion portion for signal light is read as a continuous time series by the irradiating the sweep light to the sweep light receiving surface. Accordingly, the optical image information that is held as an entirety by the photoelectric conversion portion for signal light to which the signal light is irradiated is converted into an electrical signal time series accompanying the scan of the sweep light.

The spatial positions in the photoelectric conversion portion for signal light for the optical image information correspond to the scan positions of the sweep light. The time axis of the time signal electrical signals obtained by the conversion of the optical information corresponds to the scan timing of the sweep light and is determined by the scan speed. Accordingly, if the scan speed of the sweep light is accurately determined, then the spatial positions of the sweep light and the positions on the time axis of the converted electrical signals have a relationship which is linearly proportional.

However, in actuality, it is extremely difficult to scan the light beam accurately and at a predetermined speed. For example, one of the methods of scanning the light beam at a constant speed is by light scanning by a polygonal mirror and an $f\theta$ lens. In such an optical system, variations in the rotational speed of the motor that rotates the polygonal mirror and aberrations and the like in the manufacture of the polygonal mirror, make it impossible practically, to scan at a constant speed.

In the above described apparatus for converting optical image information into electrical signals, the read accuracy of the information lowers because the scan speed of the sweep light is not accurate when the optical image information is converted into electrical signals. For example, when the electrical signals obtained from the conversion are used as the basis for the information image, that reproduced image no longer accurately corresponds to the optical image information.

Furthermore, the apparatus that converts the optical information into electrical signals is used as an information storage apparatus. The inventors of the invention of this application have proposed an information storage element of this type in Japanese Laid Open Patent Publication No. 63-34797.

In this type of conventional information storage element, when the information is read, light is irradiated in order to read that information. Then the information storage element has an electrical capacitance C for all of the elements other than those to which the light is irradiated. This electrical capacitance C is relatively large for the above described information storage elements and becomes disadvantageous when the information storage elements have a large area. For example, the above described electrical capacitance C exists for the elements in their entirety and so the electrical capacitance C becomes larger in accordance with the area of those information storage elements. Therefore when this electrical capacitance C becomes larger, there is a delay in the response when the information is stored or read.

In addition, the prior art reference Japanese Laid Open Patent Publication No. 62-139481 discloses an apparatus for converting an optical image into electrical signals. According to the content of the technology disclosed in this prior art reference, the irradiation of the optical signals that include optical image information and their conversion into electrical signals are performed at the same time. This is to say that the information storage performance of the optical image information to electrical signal conversion element is not considered. However, this does no mean that there is no information storage performance for these elements as these optical image information to electrical signal conversion elements have a storage performance for extremely short time intervals in the msec order, for example. Accordingly, the optical image information to electrical signal conversion element can be used as a temporary memory. The optical image information to electrical signal conversion element can also be termed an information storage element. When the above described optical image information to electrical signal conversion element is thought of as an information storage element, there is a problem due to the presence of the above described electrical capacitance C.

Moreover, in the information storage element disclosed in Japanese Laid Open Patent Publication No. 63-34797, it is possible to have information read whenever required. However, when new information is stored with respect to information storage elements that are already storing information, and using the information storage method disclosed in Japanese Laid Open Patent Publication No. 63-34797, it is necessary to have procedures for the prior erasure of the information that has already been stored. Therefore, it is necessary to return the information storage elements back to the initial status where there is no information stored.

SUMMARY OF THE INVENTION

Accordingly, it is a general object of the present invention to provide a novel and useful apparatus for converting optical information into electrical information signal, an information storage element and a method for such, in which the problems described heretofore are eliminated.

A more specific object of the present invention is to provide an apparatus for converting optical information into an electrical information signal, and which can efficiently convert optical information into an electrical information signal without having to increase the scan speed of the sweep light.

This object of the present invention is achieved by an apparatus for converting optical information into an electrical information signal comprising a plurality of one-dimensional conversion arrays arranged in parallel form, each of the plurality of one-dimensional conversion arrays having a first photoelectric conversion structure and a second photoelectric conversion structure integrally formed with the first photoelectric conversion structure, the first photoelectric conversion structure having a plurality of photoelectric conversion elements which are actually arranged in a direction or configured so as to be substantially equivalent to an arrangement in which the plurality of photoelectric conversion elements are arranged in the direction, each of the plurality of photoelectric conversion elements have a light receiving surface onto which information light is projected, the second photoelectric conversion structure having a plurality of photoelectric conversion elements which are actually arranged in the direction or configured so as to be substantially equivalent to an arrangement in which the plurality of photoelectric conversion elements are arranged in the direction, each of the plurality of photoelectric conversion elements having a sweep light receiving surface onto which the sweep light is projected and each of the plurality of photoelectric conversion elements electrically coupled to a corresponding one of the plurality of photoelectric conversion elements of the first photoelectric conversion structure, and the sweep light having a cross section simultaneously scanning the sweep light receiving surface of one of said plurality of photoelectric conversion elements included in each of the plurality of one-dimensional conversion arrays, and the electrical information signal being read out from the plurality of photoelectric conversion elements provided in the first photoelectric conversion structure when the sweep light is projected onto the plurality of photoelectric conversion elements provided in the second photoelectric conversion structure.

Another object of the present invention is to provide an apparatus for converting optical information into an electrical information signal, and which enables the accurate conversion of said optical image information into an electrical information signal.

This object of the present invention is achieved by an apparatus for converting optical information into an electrical information signal comprising a first photoelectric conversion structure having a plurality of photoelectric conversion elements which are actually arranged into a line or matrix or configured so as to be substantially equivalent to an arrangement in which the plurality of photoelectric conversion elements are arranged in a line or matrix, each of the plurality of photoelectric conversion elements having a light receiving surface onto which information light is projected, a second photoelectric conversion structure having a plurality of photoelectric conversion elements which are actually arranged into a line or matrix or configured so as to be substantially equivalent to an arrangement in which the plurality of photoelectric conversion elements are arranged into a line or matrix, each of said plurality of photoelectric conversion elements having a scanning sweep light receiving surface onto which the scanning sweep light is projected and each of the plurality of photoelectric conversion elements electrically coupled to a corresponding one of the plurality of photoelectric conversion elements of the first photoelectric conversion structure, and a third photoelectric conversion structure having a plurality of photoelectric conversion elements which are actually arranged into a line or matrix or configured so as to be substantially equivalent to an arrangement in which the plurality of photoelectric conversion elements are arranged into a line or matrix, each of said plurality of photoelectric conversion elements having a synchronizing sweep light receiving surface onto which the synchronizing sweep light is projected, the synchronizing sweep light being in synchronism with the scanning sweep light, an electrical synchronizing signal being generated by the third photoelectric conversion structure, the electrical information signal being read out from the plurality of photoelectric conversion elements provided in said first photoelectric conversion structure together with the electrical synchronizing signal when the sweep light is projected onto the plurality of photoelectric conversion elements provided in the second photoelectric conversion structure.

Furthermore, yet another object of the present invention is to provide an information storage element, and which has a lowered electrical capacitance no delay when there is information storage and read, and which can have a large storage area.

This object of the present invention is achieved by an information storage element comprising a first semiconductor layer, a second semiconductor layer, one of the first and second semiconductor layers being a photoelectric conversion layer, the other being an information storage layer in which optical information irradiated onto the photoelectric conversion layer is converted into electrical information and stored therein, a first electrode formed on the first semiconductor layer, and a second electrode formed on the second semiconductor layer at a position excluding a position where the second electrode confronts the first electrode. A position excluding a position where a pair of electrodes is opposite to each other means not only a case where the electrodes are not opposite to each other at all but also a case where the electrodes are partially opposite to each other so that an electrical capacitance formed thereby is too small to affect response characteristics of the information storage element at the time of storing or reading information.

Still another object of the present invention is to provide an novel information storage method that stores binary information with respect to an information storage element, and which enables the storage of new binary information even when information that has already been stored in the information element is erased.

This object the present invention is achieved by a method of storing information in an information storage element including a first semiconductor layer, a second semiconductor layer, one of said first and second semiconductor layers being a photoelectric conversion layer, the other being an information storage layer in which optical information irradiated onto the photoelectric conversion layer is converted into electrical information and stored therein, a first electrode formed on the first semiconductor layer, and a second electrode formed on the second semiconductor layer at a position excluding a position where the second electrode confronts the first electrode, the method comprising the steps of scanning the photoelectric conversion layer by a light beam, and switching the polarity of a voltage to be applied across the first and second electrodes between a positive polarity and a negative polarity in accordance with binary information to be written into the information storage layer in a state where a light beam is being projected onto the photoelectric conversion element.

Other objects and further features of the present invention will be apparent from the following detailed description when read in conjunction with the accompanying drawings.

BRIEF DESCRIPTION OF THE DRAWINGS

FIGS. 15A through 15E are views indicating an alternative embodiment of each of the embodiments of the information storage element according to the present invention.

DESCRIPTION OF THE PREFERRED EMBODIMENTS

A description will be given of a first embodiment of a device for converting optical image information into electrical information according to the present invention with reference to FIGS. 1A through 3C. The device for converting optical image information into electrical information will be termed a converting device.

Figure 1A:
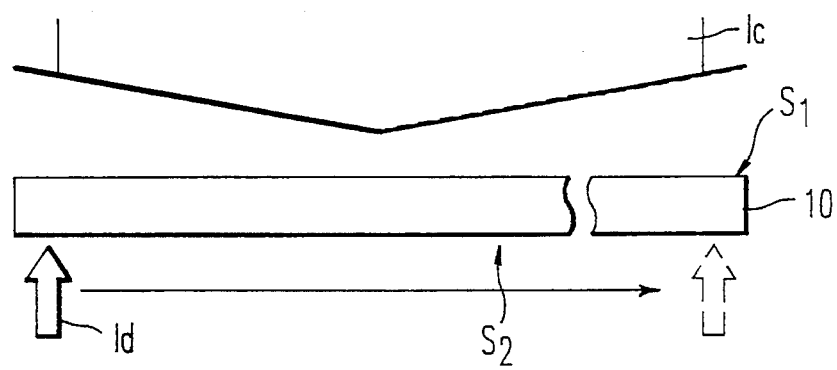
FIGS. 1A and 1B are views indicating the structure of an apparatus for the conversion of optical image information into electrical information, and relating to a first embodiment according to the present invention.
Figure 1B:
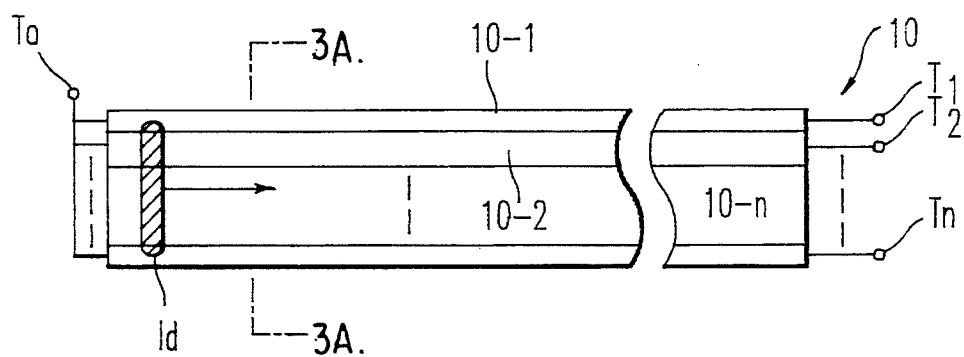

In FIG. 1A, the converting device 10 has a surface ($S_1$) and a surface ($S_2$) opposite to the surface ($S_1$). A signal light ($I_c$) including optical image information irradiates the surface ($S_1$) of the converting device 10. This signal light has two-dimensional expansion. The surface ($S_2$) of the converting device 10 is scanned with a sweep light ($I_d$) in the direction of an arrow shown in the figure. FIG. 1B is a view of the converting device 10 from the surface ($S_2$) side. The converting device 10 has a plural number of one-dimensional photoelectric conversion arrays 10-1, 10-2, . . . , 10-n. These one-dimensional photoelectric convention arrays 10-1, 10-2, . . . , 10-n are mutually arranged in parallel and each pair of two adjacent one-dimensional photoelectric conversion arrays are close to each other.

An example of a detailed structure of a one-dimensional photoelectric conversion array is disclosed in the Japanese Patent Laid open Publication No. 62-139481.

Each one-dimensional photoelectric conversion array includes first conversion elements on which the signal light is incident and which convert the signal light into an electrical signal and second conversion elements on which the sweep light is incident and which convert the sweep signal into an electrical signal. The first conversion elements are arranged in a line and the light incident planes thereof face to the surface ($S_1$) of the converting device 10. The second conversion elements are also arranged in a line and the light incident planes thereof face to the surface ($S_2$) of the converting device 10. The first conversion elements and the second conversion elements are electrically connected together. An electrode formed on the second conversion elements in each one-dimensional photoelectric arrays 10-1, 10-2, . . ., 10-n are connected to a common terminal ($T_O$). An electrode formed on the first conversion elements in each one-dimensional photoelectric arrays 10-1, 10-2, . . ., 10-n are connected to each terminals ($T_1$), ($T_2$), . . ., ($T_n$). A pair of the first and second conversion elements corresponds to a pixel.

The sweep light ($I_d$) has a section having a shape which is long and narrow as is shown by the area having slant lines in FIG. 1B. The shape is long in the direction of the arrangement of the one-dimensional photoelectric arrays 10-1, 10-2, . . ., 10-n. Thus, all the one-dimensional photoelectric arrays 10-1, 10-2, . . . , 10-n are irradiated and scanned by the sweep light ($I_d$) at the same time.

Figure 2:
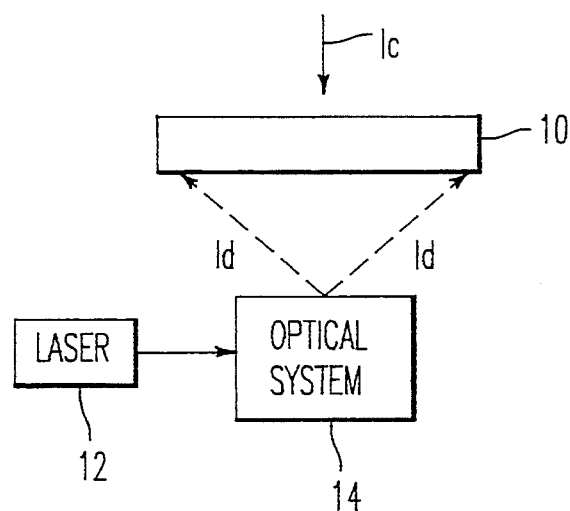
FIG. 2 is a view indicating the basic configuration of the mechanism for scanning the sweep light.

The fundamental structure of a mechanism in which the sweep light ($I_d$) scans the converting device 10 is shown in FIG. 2.

A laser beam emitted from a laser device 12 is supplied to an optical system 14. The optical system 14 has mirrors, lenses, a mechanism having a deflection function and the like. The optical system 14 also has a mechanism for converting the shape of the beam section to a shape which is long and narrow, as has been described above. The beam deflected by the optical system 14 irradiates from one end of the converting device 10 to another end as the sweep light ($I_d$). Then the sweep light ($I_d$) scans the converting device 10 with a constant speed.

In each one-dimensional photoelectric conversion array 10-$i$ ($i$=1, 2, ..., or n), while the sweep light scans, the electrical information corresponding to the optical image information included in the signal light can be obtained as an output signal appearing between the common terminal ($T_O$) and the terminal ($T_i$). Thus, when the sweep light scans the surface ($S_2$) of the converting device 10 only once, electrical signals corresponding to the optical image information for n-lines are obtained. If, once every scanning, for example, a document as a source of the optical image information, is moved n-lines in the perpendicular direction to the scanning direction, one-dimensional optical image information can be read every n-line.

A description will now be given of the detailed structure of the converting device 10 with reference to FIGS. 3A through 3C, each of which is a cross sectional view along line A—A shown in FIG. 1B.

Figure 3A:
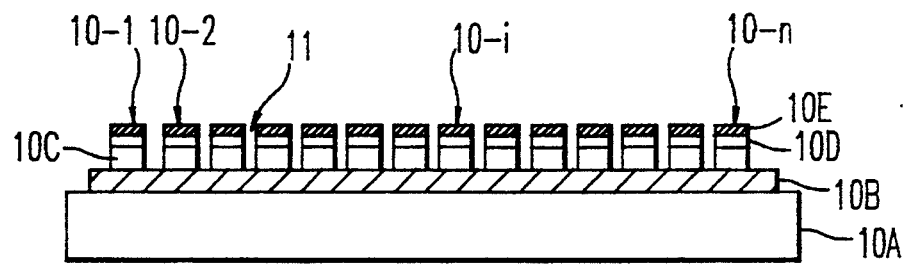
FIGS. 3A through 3C are views indicating the detailed structure of an apparatus for converting optical information into electrical signals, and relating to a first embodiment according to the present invention.
Figure 3B:
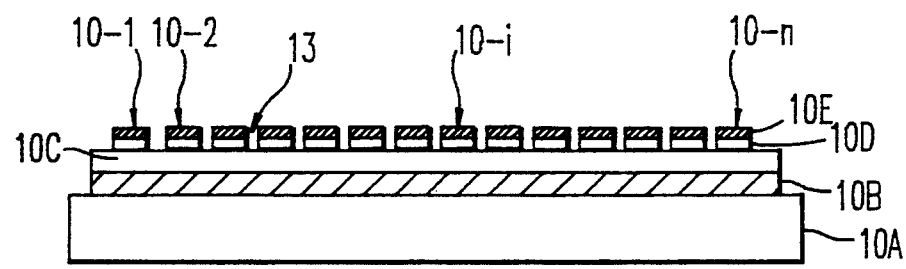
Figure 3C:
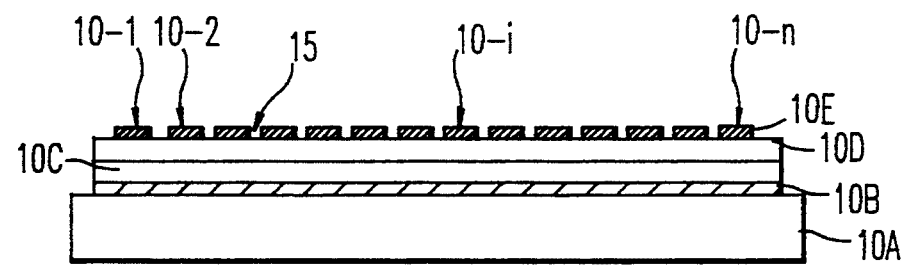

In each example shown in FIGS. 3A through 3C, n one-dimensional photoelectric conversion arrays 10-1, 10-2, ..., and 10-$n$ are integrated on a substrate 10A. An electrode layer 10B is formed on the substrate 10A, a second photoelectric conversion layer 10C is formed on the electrode layer 10B, a first photoelectric conversion layer 10D is provided on the second photoelectric conversion layer 10C and an electrode layer 10E is formed on the first photoelectric conversion layer 10D. The substrate 10A and the electrode layers 10B and 10E are transparent. Either one of these layers or two or more of these layers 10A through 10E have gaps which isolate the one-dimensional photoelectric conversion arrays 10-1, 10-2, ..., and 10-$n$ from each other.

In FIG. 3C only the electrode layer 10E has gaps 15 which isolate the one dimensional photoelectric conversion arrays 10-1, 10-2, ..., and 10-$n$ from each other. When a resistivity of the first photoelectric conversion layer 10D is relatively large, the isolated one-dimensional photoelectric conversion arrays 10-1, 10-2, ..., and 10-$n$ can be formed only in the electrode layer 10E. In FIG. 3B, the electrode layer 10E and the first photoelectric conversion layer 10D have gaps 13 so that isolated one-dimensional photoelectric conversion arrays are formed. Further, in FIG. 3A, the electrode layer 10E and the first and the second photoelectric conversion layers 10D and 10C have gaps 11 so that isolated one-dimensional photoelectric conversion arrays are formed.

In a structure where three layers have gaps 11 as is shown in FIG. 3A, the one-dimensional photoelectric conversion arrays 10-1, 10-2, ..., and 10-$n$ are definitely isolated from each other.

In a structure where only one or two layers have gaps 13 or 15 as is shown in FIGS. 3B or 3C, it is not necessary that the gaps be deeply formed in order to isolate the one-dimensional photoelectric conversion arrays 10-1, 10-2, ..., and 10-$n$ from each other. The one-dimensional photoelectric conversion arrays 10-1, 10-2, ..., and 10-$n$ can be isolated from each other when only one layer (10E) has gaps (15) as is shown in FIG. 3C. In this case, it is necessary that the resistivity of the first photoelectric conversion layer 10D should be relatively large as has been described above.

An arbitrary structure with respect to the photoelectric conversion layer disclosed in Japanese Laid Open Patent Publication No. 62-139481 is applicable to the structure of the first and the second photoelectric conversion layers 10D and 10C above mentioned. In addition, the first photoelectric layer 10D and the second photoelectric layer 10C are directly and electrically connected with each other.

The signal light ($I_c$) irradiates the surface of the first photoelectric conversion layer 10D via the electrode layer 10E. Then, the first photoelectric conversion layer 10D generates an electrical charge corresponding to the incident light. When this occurs the sweep light ($I_d$) irradiates and scans the surface of the second photoelectric conversion layer 10C via the substrate 10A and the electrode layer 10B. Then, the portion of the second photoelectric layer 10C irradiated by the sweep light attains a conductive status and an electrical signal corresponding to the electrical charge in the first photoelectric layer 10D is output from each one-dimensional photoelectric conversion array.

The sweep light ($I_d$) and the signal light ($I_c$) are incident in opposite directions with respect to the converting device 10. However, whether or not the substrate 10A and electrode layers 10B and 10E are transparent, the light absorption-transmission characteristics of the first and the second photoelectric conversion layers 10D and 10C and the spectral sensitivity thereof are adjustable so that the incident direction of the sweep light ($I_d$) and the signal light ($I_c$) with respect to the converting device 10 are arbitrarily determined.

In the conversion device 10, as is shown in FIGS. 3A through 3C, the gaps 11, 13, 15 which isolate the one-dimensional photoelectric conversion arrays 10-1, 10-2, ..., and 10-$n$ from each other are much narrower than the width of one line of the image on the other hand, the gaps which isolate the one-dimensional photoelectric conversion arrays 10-1, 10-2, ..., and 10-$n$ from each other can also be wider than those shown in FIGS. 3A, 3B, and 3D.

Figure 4:
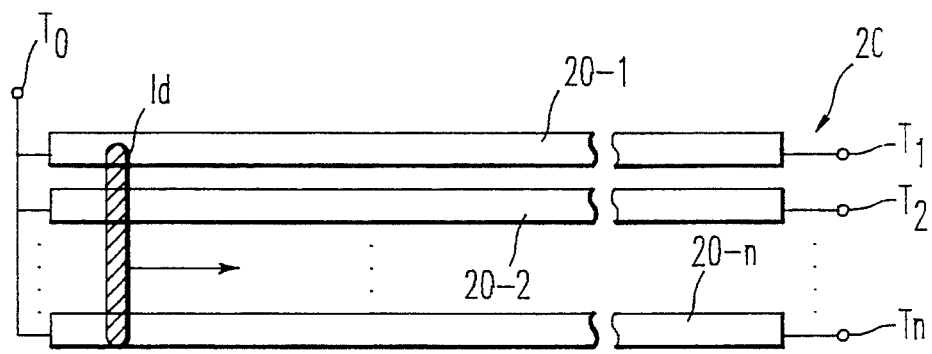
FIGS. 4 and 5 are views indicating an alternative first embodiment according to the present invention.

In FIG. 4, a converting device 20 has a plural number of one-dimensional photoelectric conversion arrays 20-1, 20-2, ..., and 20-$n$. These one-dimensional photoelectric conversion arrays 20-1, 20-2, ..., and 20-$n$ are mutually arranged in parallel at a pitch of two times the width of a pixel. Each of the one-dimensional photoelectric conversion arrays 20-1, 20-2, ..., and 20-$n$ are electrically connected to the common terminal ($T_0$) and to the terminal ($T_i$) ($i$=1, 2, ..., and n), in the same way as is shown in FIG. 1B. The sweep light ($I_d$) irradiates and scans all the one-dimensional photoelectric arrays 20-1, 20-2, ..., and 20-$n$ at the same time. In this case, when the sweep light scans the converting device 20 only once, an area of an optical image for 2n lines is scans. Then, the optical image information is converted to an electrical signal for every second line. The sweep light scans the converting device 20 once, a document which is a source of the optical image information is moved one line in the perpendicular direction to the scanning direction and then the sweep light scans the converting device 20 once more. When two scannings are performed in this manner, the converting device 20 outputs electrical signals for 2n lines.

In general, the plural number (n) of the one-dimensional photoelectric arrays 20-1, 20-2, ..., and 20-n are arranged in parallel at a pitch of (m) times the width of a pixel so that when the sweep light scans the converting device (m) times, the converting device outputs electrical signals for (m.n) lines.

Figure 5:
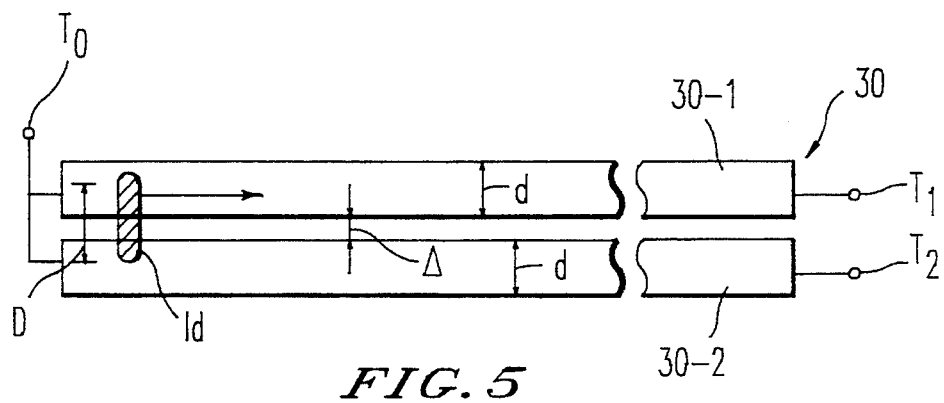

A converting device 30 having another structure is shown in FIG. 5. In the converting device 30, two one-dimensional photoelectric conversion arrays 30-1 and 30-2 are arranged in parallel and close together. A width (d) of each of the one-dimensional photoelectric conversion arrays 30-1 and 30-2 are larger than the width of a pixel (one-line). In addition, a length (D) of the section of the sweep light ($I_d$) in the direction of the arrangement of the one-dimensional photoelectric conversion arrays 30-1 and 30-2 is determined in accordance with the following formula.

$$D = 2\ell + \Delta$$

$\ell$: The width of a pixel (one line)
$\Delta$: The width of a gap between two one-dimensional photoelectric conversion arrays 30-1 and 30-2.

In this case, when the sweep light ($I_d$) scans the converting device 30 once, the converting device 30 outputs electrical signals for two lines. The width $\Delta$ of the gap is determined as a width for (m-1 pixels (lines)) so that when the sweep light scans the converting device 30 (m) times, the converting device 30 outputs electrical signals for 2m lines.

The converting device 30 as is shown in FIG. 5 is advantageous in that it is not necessary to form the one-dimensional photoelectric conversion array having a narrow width.

In each embodiment as has been described above, insulating materials, materials for shading light and the like can be filled in the gaps to isolate the one-dimensional photoelectric conversion array from each other so that the one-dimensional photoelectric conversion arrays are definitely electrically isolated from each other.

According to the converting device as has been described above, when the sweep light scans the converting device once, sweep light scans the converting device once, the converting device is capable of converting the optical image information for a plural number of lines into the electrical signals. Thus, the converting device can efficiently convert the optical information into electrical signals without having to increase the scanning speed of the sweep light.

A description will now be given of the second embodiment of the converting device according to the present invention.

Each of the aforementioned one-dimensional photoelectric arrays has an equivalent circuit indentical to one of the three equivalent circuits disclosed in Japanese Laid-Open Patent Publication No.62-139481.

Figure 6:
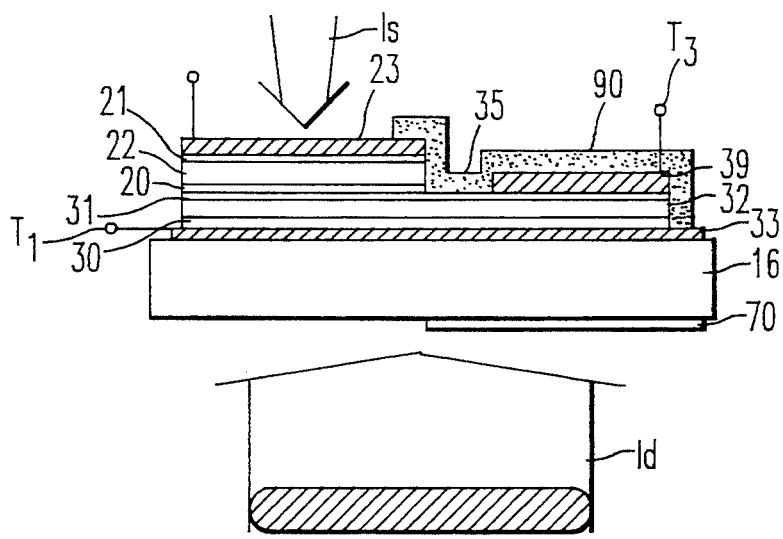
FIG. 6 is a view indicating the structure of an apparatus for the conversion of optical image information into electrical information, and relating to a second embodiment according to the present invention.

FIG. 6 shows a sectional view of the converting device from the perpendicular direction with respect to the scanning direction. This converting device corresponds to the one-dimensional photoelectric conversion array as has been described above.

In FIG. 6, a substrate 16 is transparent. An electrode 33 is transparent and is provided on the substrate 16. The electrode 33 is made of indium oxide or the like. A p-type amorphous silicon layer is formed on the electrode 33 as a first conduction type semiconductor layer 30. An i-type (intrinsic) amorphous silicon layer is formed on the semiconductor layer 30 as a photoelectric layer 32. Further, an n-type amorphous silicon layer is provided on the photoelectric layer 32 as a semiconductor layer 31 having a conductivity opposite to that of the first conduction type semiconductor layer 30.

On the semiconductor layer 31, a first conduction type semiconductor layer 20 having a p-type amorphous silicon layer and a electrode 39 are formed at a distance from each other. The semiconductor layer 20 is positioned on the left-hand portion of the semiconductor layer 31 in the figure and the electrode 39 is positioned on the right-hand portion of the semiconductor layer 31 in the figure. Thus there is a gap 35 between the semiconductor layer 20 and the electrode 39. A photoelectric layer 22 having an i-type amorphous silicon layer, and on which a semiconductor layer 21 of an n-type amorphous silicon layer is provided, is formed on the semiconductor layer 20. A electrode 23 is transparent and is formed on the semiconductor layer 21. A shading layer 90 which prevents a light from the outside from entering is provided so as to cover the electrode 39, the gap 35 and a side area of a surface of the electrode 23 on which a light is incident. The shading layer 90 also covers side faces of the semiconductor layer 20, the photoelectric layer 22, the semiconductor layer 21 and the electrode 23, adjacent to the gap 35. The shading layer 90 further covers side faces of the semiconductor layer 30, the photoelectric layer 32, the semiconductor layer 31, and the electrode 39 which is on the side opposite to that provided with the semiconductor layer 20. The electrode 33 is connected to a terminal ($T_1$) and the electrode 23 is connected to a terminal ($T_2$). The electrode 39 is connected to a terminal ($T_3$). A grating layer 70 is formed on a surface of the substrate 16 opposite to the surface on which the electrode 33 is provided. This grating layer 70 is positioned on the right-hand portion of the substrate 16 in the figure. A description of the grating layer 70 will be given later.

In FIG. 6, the semiconductor layers 20 and 21 and the photoelectric layer 22 form a photoelectric conversion layer having an arrangement equivalent to a pin photodiode. The semiconductor layer 30 and 31 and the photoelectric layer 32 also form a photoelectric conversion layer having an arrangement equivalent to a pin photodiode. The semiconductor layer 20, the photoelectric layer 22 and the semiconductor layer 21, which are stacked in this order, substantially provide a plural number of pin photodiodes arranged in direction orthogonal to the drawing. A first photoelectric conversion element is formed by each pin photodiode together with the transparent electrode 23. The semiconductor 30, the photoelectric layer 32 and the semiconductor layer 31, which are stacked in this order, substantially provide pin photodiodes in two rows. Onr of the two rows of pin photodiodes is formed by a left-hand portion of the stacked layers 30, 32, and 31 and the other row of pin photodiodes is formed by a right-hand portion of the stacked layers 30, 32, and 31. A second photoelectric conversion element for a sweep light is formed by each pin photodiode of the left-hand portion of the stacked layers 30, 32, and 31 together with the transparent electrode 33. A third photoelectric conversion element for a sweep light for synchronization is formed by each pin photodiode of the right-hand portion of the stacked layers 30, 32, and 31 together with the electrode 39 and transparent electrode 33. The semiconductor layers 31 and 20 are electrically connected to each other.

In the grating layer 70, transparent areas and shading areas are alternately arranged in the direction orthogonal to the drawing. A light transmits through the transparent areas and is interrupted by the shaded areas. The arrangement of the transparent areas and the shaded areas corresponds to the arrangement of pixels.

The sweep light ($I_d$) has a section having a shape which is long in the direction perpendicular to the scanning direction and narrow in the area having hatching in FIG. 6. The sweep light ($I_d$) irradiates via substrate 16 the second photoelectric conversion element at the third photoelectric conversion element at the same time. That is, the sweep light ($I_d$) also has a function as a sweep light for synchronization. A sweep light for synchronization. A signal light ($I_s$) including one-dimensional optical image information is supplied to the converting device from the side of the transparent electrode 23. Then, the sweep light ($I_d$) irradiates and scans the substrate 16. When this occurs, the sweep light ($I_d$) irradiates the transparent areas and the shaded areas of the grating layer 70 and only through the transparent areas is the sweep light ($I_d$) incident to the right-hand portion of the photoelectric conversion layer (i.e. the third photoelectric conversion element). Thus, a pulse signal corresponding to the arrangement of pixels is generated between the terminals ($T_1$) and ($T_3$). On the other hand, through the substrate 16 the sweep light ($I_d$) is incident to the left-hand portion of the photoelectric conversion layer (i.e. the second photoelectric conversion element), while the sweep light ($I_d$) is scanning. Thus, because of the scanning of the sweep light ($I_d$), an electrical signal corresponding to the one-dimensional optical image information appears between the terminals ($T_1$) and ($T_2$).

A clock signal is generated on the basis of the pulse signal. Then, the electrical signal which appears between the terminals ($T_1$) and ($T_2$) is sampled in synchronization with the clock signal. A read signal is provided from this sampled signal.

In this manner, it is possible to correctly read the optical image information for every pixel and to convert the optical image information into an electrical signal.

Figure 7A:
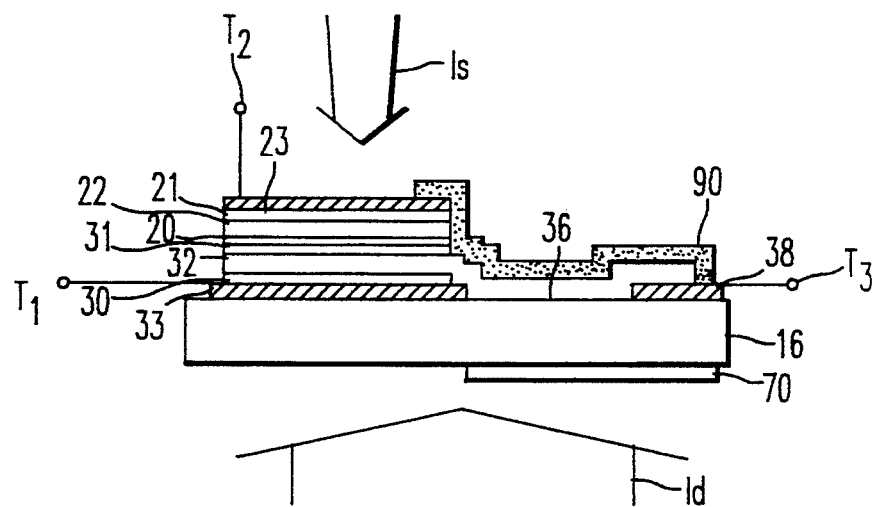
FIGS. 7A and 7B are views indicating an alternative second embodiment according to the present invention.

Another embodiment of the converting device according to the present invention is shown in FIG. 7A. In FIG. 7A, those parts which are the same as those shown in FIG. 6 are given the same reference numbers.

In FIG. 7A, the left-hand portion of this converting device, that is, the element for reading the photo image information, has the same structure as that shown in FIG. 6. The grating layer 70 is also provided on the substrate 16 in the same manners shown in FIG. 6.

The structure of the photoelectric conversion layer (i.e. the third photoelectric conversion element) used for the sweep light synchronization differs from that shown in FIG. 6.

On the substrate 16, the transparently electrode 33 and the electrode 38 are formed at a distance from each other there is a gap 36 between the electrode 33 and 38. The semiconductor layer 30 is formed on the transparent electrode 33. The photoelectric layer 32 (i-type amorphous silicon layer) is formed on the semiconductor layer 30 and extends to the gap 36 and to the electrode 38. As a result, the photoelectric layer 32 is provided on the substrate where the gap is formed and on the electrode 38. The electrodes 33 and 38, the photoelectric layer 32 and the semiconductor layer 30 substantially provide a plural number of photodiodes arranged in the direction orthogonal to the drawing. The electrode 38 is connected to the terminal ($T_3$). The sweep light ($I_d$) also functions as a sweep light for synchronization in the same manner as described in the embodiment shown in FIG. 6.

The signal light ($I_s$) including the photo image information irradiates the converting device from the side of the transparent electrode 23. In this status, when the sweep light ($I_d$) irradiates and scans the transparent substrate 16, a pulse signal having a shape corresponding to the arrangement of the pixels of the photo image information is generated between the terminals ($T_1$) and ($T_3$). When this occurs, an electrical signal corresponding to the photo image information appears between the terminals ($T_1$) and ($T_2$). A clock signal to determine a read timing is generated or the basis of the pulse signal above mentioned. Then, the electrical signal which appears between the terminals ($T_1$) and ($T_2$) is sampled in synchronism with the clock signal. This sampled signal is provided as the read signal.

Figure 7B:
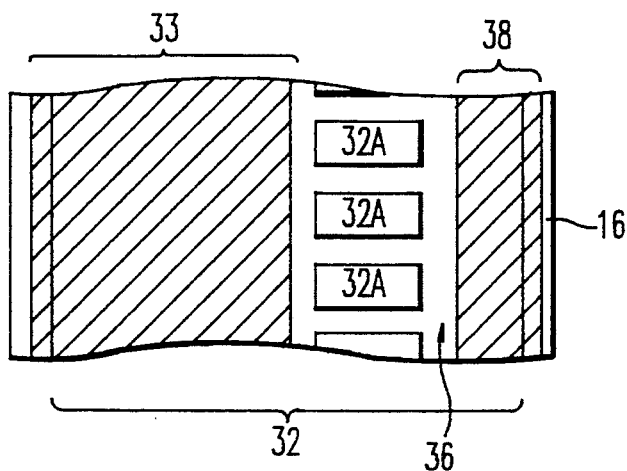

A modification of the embodiment shown in FIG. 7A is shown in FIG. 7B.

In this modification, there is no grating layer 70. Instead of this grating layer 70, insulation parts 32A are formed in the photoelectric layer 32 positioned in the gap 36 between the electrodes 33 and 38. In the photoelectric layer 32 (an i-type amorphous silicon layer) positioned in the gap 36, notches are formed so as to form windows and one of the insulation parts 32A is formed in each of these notches. The arrangement of the notches corresponds to the arrangement of the pixels. That is, the insulation parts 32A are arranged at regular intervals corresponding to the arrangement of the pixels in the direction orthogonal to the drawing. The sweep light for synchronization (the right-hand portion of the sweep light ($I_d$)) scans the converting device from the transparent substrate 16. When the sweep light ($I_d$) irradiates an area where there is not one of the insulation parts 32A of the photoelectric layer 32, the impedance between the terminals ($T_1$) and ($T_3$) becomes small. When the sweep light ($I_d$) irradiates an area where there is one of the insulation parts 32A, the impedance between the terminals ($T_1$) and ($T_3$) becomes large. Thus, while the sweep light scans, a periodic pulse signal is generated between the terminals ($T_1$) and ($T_3$) and the clock signal is provided on the basis of the pulse signal. Then, the read signal of photo image information is obtained by use of the clock signal.

In this case, the photoelectric layer 32 is not sandwiched between the electrodes 33 and 38 in the vertical direction so that the electrostatic capacity between the terminals ($T_1$) and ($T_3$) becomes small. Thus, it is possible to perform a high-speed operation.

Figure 8:
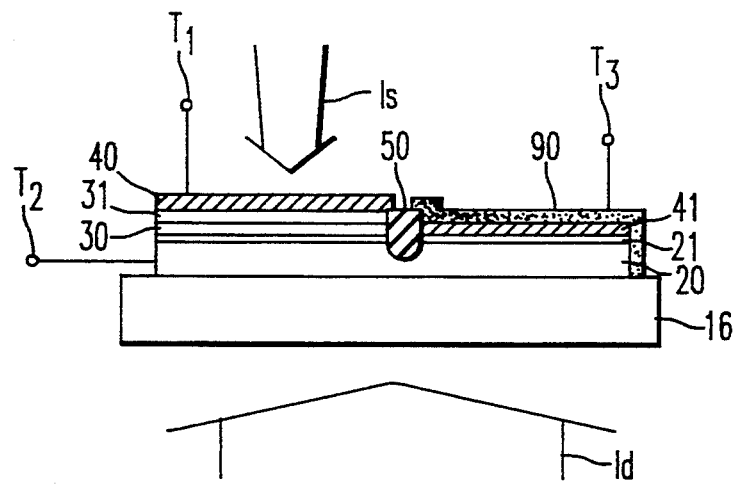
FIG. 8 is a view indicating a fourth embodiment according to the present invention.

A description will now be given of a fourth embodiment of the converting device according to the present invention with reference to FIG. 8. In FIG. 8, those parts which are the same as those shown in FIG. 6 are given the same reference numbers.

The semiconductor layer 20 is a first conduction type semiconductor layer, and for example, a p-type amorphous silicon layer. The semiconductor layer 20 is formed on the transparent substrate 16. The semiconductor layers 21 have a conductivity opposite to that of the first conductive type semiconductor 20. The semiconductor layers 21 are formed on the semiconductor 20 and are isolated from each other by an insulation member 50. On the semiconductor layer 21 formed on the left-hand portion of the semiconductor layer 20 in FIG. 8, the first conduction type semiconductor layer 30, the semiconductor layer 31 having a conductivity opposite to that of the first conductive type semiconductor layer 30 and a transparent electrode 40 are, in this order, stacked. On the semiconductor layer 21 formed on the right-hand portion of the semiconductor layer 20 in the figure, an electrode 41 and the shading layer 90 are, in this order, stacked. The shading layer 90 also covers the side face of the electrode 41, the semiconductor layer 21 and the semiconductor layer 20. The stacked layers 21, 30 and 31 formed on the left-hand portion on the semiconductor layer 20 and the stacked layers 21 and 41 formed on the right-hand portion on the semiconductor layer 20 are electrically isolated by the insulation member 50 formed on the semiconductor layer 20 from each other along a line in the direction orthogonal to the drawing. The semiconductor layer 20 is electrically connected to the terminal ($T_2$). The transparent electrode 40 is connected to the terminal ($T_1$). The electrode 41 is connected to the terminal ($T_3$).

The semiconductor layers 30 and 31 form a photodiode layer having a pn junction, and the photodiode layer constructs a photoelectric conversion layer for the signal light together with the transparent electrode 40. The semiconductor layers 20 and 21 also form a photodiode. The left-hand portion of the stacked layers 20 and 21 in FIG. 8 construct a photoelectric conversion layer for the sweep light ($I_d$). The right-hand portion of the stacked layers 20 and 21 in FIG. 8 form a photoelectric conversion layer for the sweep light for synchronization.

Each of the stacked layers 21, 30, and 31 on the left-hand portion of the semiconductor layer 20 are divided into portions corresponding to pixels by insulation members in the direction orthogonal to the drawing. The semiconductor layer 21 is also divided into portions corresponding to pixels by insulation members in the same manner as the stacked layers 21, 30 and 31. Thus, in each of the three photoelectric conversion layers described above, the photodiodes corresponding to pixels are one-dimensionally arranged in the direction orthogonal to the drawing.

The structure where the stacked layer 21, 30 and 31 for converting the signal light into the electrical signal are divided into portions corresponding to pixels has been disclosed in the Japanese Laid Open Patent Publication No. 62-139481. The semiconductor layers 21 and 30 are electrically connected to each other. The sweep light ($I_d$) in this embodiment also functions as the sweep light for synchronization. In the status where the signal light ($I_s$) including the optical image information irradiates the transparent electrode 40, when the sweep light ($I_d$) scans the surface of the transparent substrate 16 in the direction orthogonal to the drawing, the pulse signal is generated between the terminals ($T_1$) and ($T_3$) and an electrical signal appears between the terminals ($T_1$) and ($T_2$) at the same time. The shape of the pulse signal corresponds to the arrangement of the insulation members, as has been described above, in the semiconductor layer 21 on the left-hand portion of the semiconductor layer 20. That is, the shape of the pulse signal corresponds to the arrangement of the pixels. The clock signal is generated on the basis of the pulse signal and the electrical signal from the terminals ($T_1$) and ($T_2$) is sampled in synchronization with the clock signal so that the optical image information is properly read and an electrical signal accurately corresponds to every pixel.

In the embodiments as has been described with reference to FIGS. 6, 7A, 7B and 8, one-dimensional optical image information is converted into an electrical signal. On the other hand, it is possible to provide a device having a structure where a plural number of the converting devices as is shown in FIGS. 6, 7A, 7B and 8 are closely arranged in parallel in the direction orthogonal to the direction of the scanning by the sweep light. In this case, when the signal light including two-dimensional optical image information irradiates the photoelectric conversion layers arranged in parallel for a signal light, and the sweep light two-dimensionally scans the photoelectric conversion layers for the sweep light and the photoelectric conversion layers for the sweep light for synchronization, it is possible to read the two-dimensional optical image information properly.

In addition, it is possible to provide the photoelectric conversion layer for the sweep light for synchronization to the device as has been shown in FIGS. 3A, 3B and 3C. In this case, the sweep light irradiates and scans the photoelectric conversion layer for the sweep light for synchronization, and the electrical signals from each of the one-dimensional photoelectric conversion arrays 10-1, 10-2, ... and 10-$n$ are sampled with synchronization in the clock signal which is generated on the basis of the pulse signal which appears from the photoelectric conversion layer for the sweep light for synchronization.

Further, in the embodiments as has been described with reference to FIGS. 6, 7A, 7B and 8, the shading layer 90 is provided. The shading layer 90 prevents a stray light from entering to the photoelectric conversion layer for the sweep light for synchronization so that the generation of an error pulse signal is prevented. Thus, if the converting device is used in such a manner that there is no stray light, the converting device is not necessarily provided with the shading layer 90.

A description now will be given of a fifth embodiment of the converting device according to the present invention with reference to FIGS. 9A and 9B. In the FIGS. 9A and 9B, those parts which are the same as those shown in FIG. 6 are given the same reference numbers.

Figure 9A:
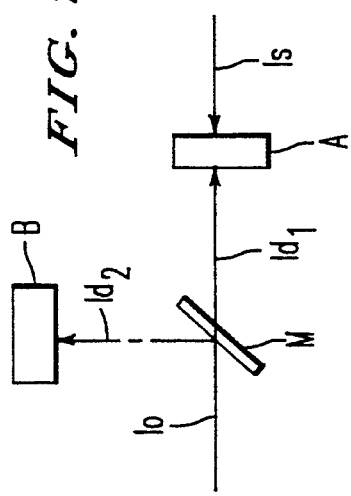
FIGS. 9A and 9B are views indicating fifth embodiment according to the present invention.

This converting device has the transparent substrate 16 and the grating layer 70 which is provided on the right-hand portion of the surface of the substrate 16 in FIG. 9A. The sweep light ($I_d$) irradiates and scans the converting device from the side of the surface on which the grating layer 70 is provided, the same as has been described above. A transparent electrode 2T is formed on a surface of the substrate 16 opposite to the surface on which the grating layer 70 is provided. A photoelectric conversion layer 2 is provided on the transparent electrode 2T. Another photoelectric conversion layer 3 is formed on the photoelectric conversion layer 2. Both of these photoelectric conversion layers 2 and 3 have structures in which photodiodes are one-dimensionally arranged in the direction orthogonal to the drawing or have structures in which photodiodes are substantially one-dimensionally arranged. These photoelectric conversion layers 2 and 3 have, for example, structures having photodiode layers as are shown in FIGS. 6, 7A, 7B and 8. On the photoelectric conversion layer 3, transparent electrodes 31T and 32T are formed at a distance from each other. The transparent electrode 31T is positioned on the left-hand portion of the photoelectric conversion layer 3 in FIG. 9A. The transparent electrode 32T is positioned on the right-hand portion of the photoelectric convertion layer 3 in FIG. 9A. Thus there is a gap 4 between the transparent electrodes 31T and 32T.

In FIG. 9A, the left-hand portions of stacked layers 2T, 2 and 3 and the transparent electrode 31T form "an optical image reading element". The right-hand portions of stacked layers 2T, 2 and 3 and the transparent electrode 32T form the photoelectric conversion layer for the sweep light for synchronization.

The signal light including the one-dimensional optical image information irradiates the transparent electrode 31T. A homogeneous light ($I_c$) irradiates the transparent electrode 32T and is incident via the transparent electrode 32T on the photoelectric conversion layer 3 becomes active. Intensity of the homogeneous light ($I_c$) is almost constant spatially and timewise. In the status where the signal light ($I_s$) and the homogeneous light ($I_c$) irradiate the converting device as has been described above, the sweep light irradiates and scans the converting device from the side of the transparent substrate 16. Then the sweep light ($I_d$) is incident via the grating layer 70, the transparent substrate 16 and the transparent electrode 2T on the photoelectric conversion layer 2 as the sweep light for synchronization.

While the sweep light ($I_d$) scans the converting device, an electrical signal corresponding to optical image information appears between the electrodes 2T and 31T, and a pulse signal having a shape corresponding to the arrangement of the pixels is generated between the electrodes 2T and 32T. Then, a clock signal for synchronization is generated on the basis of the pulse signal, and an image signal is obtained with synchronization in the clock signal from the electrical signal which appears between the electrodes 2T and 31T.

In this case, the pulse signal having the shape corresponding to the arrangement of the pixels is generated by the grating layer 70 and a system having a light source which emits the homogeneous light, ($I_c$) the light irradiating the converting device.

Figure 9B:
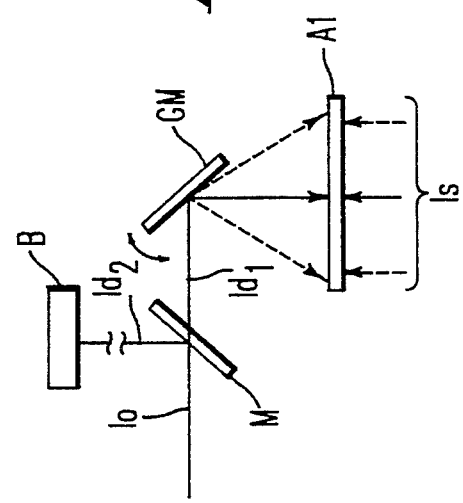

The modification of the fifth embodiment shown in FIG. 9A is also shown in FIG. 9B. In FIG. 9B, those parts which are the same as those shown in FIG. 9B are given the same reference numbers.

The structure of the converting device as is shown in FIG. 9B differs from that shown in FIG. 9A in that the grating layer 70 is formed on the transparent electrode 32T and the homogeneous light ($I_c$) irradiates via the grating layer 70 and the transparent electrode 32T the photoelectric conversion layer 3.

When the homogeneous light ($I_c$) irradiates via the grating layer 70 and the transparent electrode 32T the photoelectric conversion layer 3, portions of the photoelectric conversion layer 3, corresponding to the transparent areas of the grating layer 70 become active. Thus, the sweep light ($I_d$) scans the surface of the transparent substrate 16 so that the pulse signal having a shape corresponding to the arrangement of the transparent areas (i.e. pixels) is generated between the electrodes 2T and 32T. Then the clock signal is generated on the basis of the pulse signal. The image signal is obtained with synchronization in the clock signal from the electrical signal which appears between the terminals 2T and 31T during scanning of the sweep light ($I_d$). In this case, the pulse signal having the shape corresponding to the arrangement of pixels is also generated by the grating layer 70 and a system having a light source which emits the homogeneous light ($I_c$) the light ($I_c$), the light ($I_c$) irradiating the converting device.

In these examples as are shown in FIGS. 9A and 9B, it is possible for the signal light ($I_s$) and the homogeneous light ($I_c$) to irradiate from the side of the transparent substrate 16 and the sweep light ($I_d$) to irradiate from the side of the transparent electrodes 31T and 32T.

The signal light ($I_s$) and the homogeneous light ($I_c$) irradiate the converting device from the same side of the converting device so that it is necessary to prevent the homogeneous light ($I_c$) from irradiating the area for generating the image signal and to prevent the signal light ($I_s$) from irradiating the area for generating the pulse signal for synchronization. Thus, for example a shading mechanism is provided on an area which forms a boundary between an area where the signal light irradiates and an area where the homogeneous light irradiates. Further, for example, the homogeneous light is isolated from another light and guided by a waveguide.

A description will now be given of a mechanism for the sweep light scanning and the sweep light for synchronization with reference to FIGS. 10A, 10B and 10C.

Figure 10A:
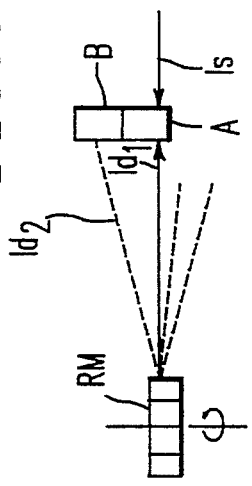
FIGS. 10A, 10B and 10C are views indicating the sweep light and the principle of the mechanism that performs scan of the sweep light.

In FIG. 10A, an element (A) has the photoelectric conversion layer for the signal light and the photoelectric conversion layer for the sweep light. These photoelectric conversion layers in the element (A) are electrically connected each other. The structure of this element (A) is disclosed in Japanese Laid Open Patent Publication No. 62-139481. An element (B) has the photoelectric conversion layer for the sweep light for synchronization. The element (B) outputs the pulse signal for synchronization while the sweep light for synchronization scans the element (B). In each of the embodiments as has been described above, the element (A) and the element (B) are integrated. However, these elements (A) and (B) are not necessarily integrated, and may be separated from each other.

In FIG. 10A, for example, a light ($I_o$) emitted from a light source is deflected in the direction orthogonal to the drawing by an optical system such as shown in FIG. 2. The deflected light ($I_o$) is incident on a semitransparent mirror (M). Then, a part of the light ($I_o$) is transmitted through the semitransparent mirror (M) and the remainder is reflected on the semitransparent mirror (M). The light which is transmitted through the semitransparent mirror (M) and scans the element (A) is the sweep light ($I_{d1}$). The light which is reflected on the semitransparent mirror (M) and scans the element (B) is the sweep light ($I_{d2}$) for synchronization. The signal light ($I_s$) is also incident on a surface of the element (A) opposite to the surface where the sweep light scans.

Figure 10B:
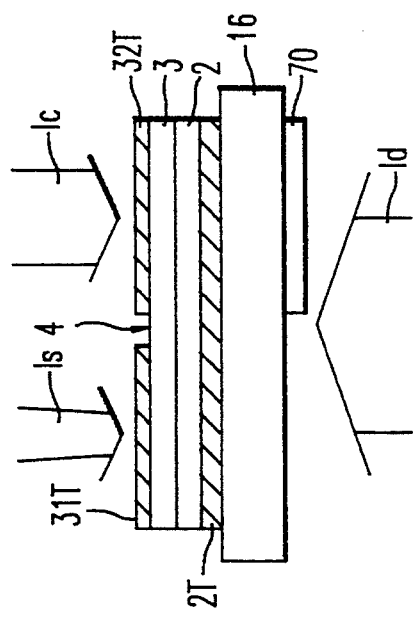

In FIG. 10B, the element (A) for reading the optical image and the element (B) for generating the pulse signal for synchronization are arranged in a line and connected to each other. A first light indicated by a solid line in FIG. 10B emitted from a first light source (not shown in FIG. 10B) is incident on a polygonal mirror (RM) which is rotated. Then, the first light which is deflected in the direction orthogonal to the drawing by the polygonal mirror (RM) and scans the element (A) is the sweep light ($I_{d1}$). On the other hand, a second light indicated by a dotted line in FIG. 10B emitted from a second light source (not shown in FIG. 10B) is also incident on the polygonal mirror (RM). Then the second light which is deflected in the direction orthogonal to the drawing by the polygonal mirror (RM) and scans the element (B) is the sweep light ($I_{d2}$) for synchronization. The incident angle of the first light with respect to the polygonal mirror (RM) is determined so that the first light which is the sweep light ($I_{d1}$) positively hits the element (A). The incident angle of the second light with respect to the polygonal mirror (RM) is determined so that the second light which is the sweep light ($I_{d2}$) for synchronization positively hits the element (B).

Figure 10C:
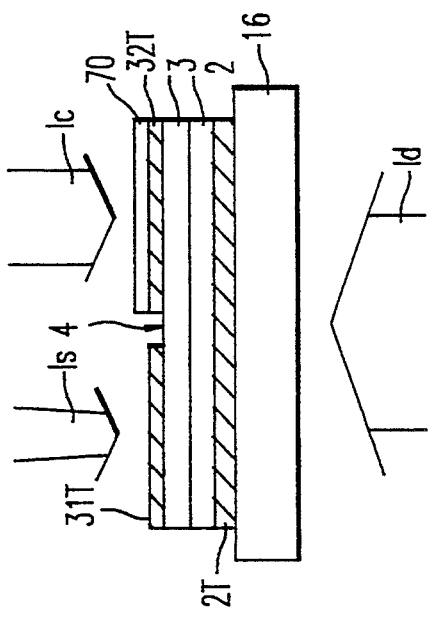

In FIG. 10C, the light ($I_o$) from the optical system is separated into the two lights by the semitransparent mirror (M) in the same manner as the case shown in FIG. 10A. One light is the sweep light for synchronization and scans the element (B). The other light is incident on the mirror (RM) which is rotated on a surface of the drawing so that the other light scans the element ($A_1$) for reading the optical image in the direction parallel to the drawing (subscan). Thus, the other light which scans the element ($A_1$) two-dimensionally is the sweep light ($I_{d1}$).

In this case, the element ($A_1$) has a structure in which the photoelectric conversion elements are two-dimensionally arranged. Thus, it is possible to read the two-dimensional optical image.

Figure 11:
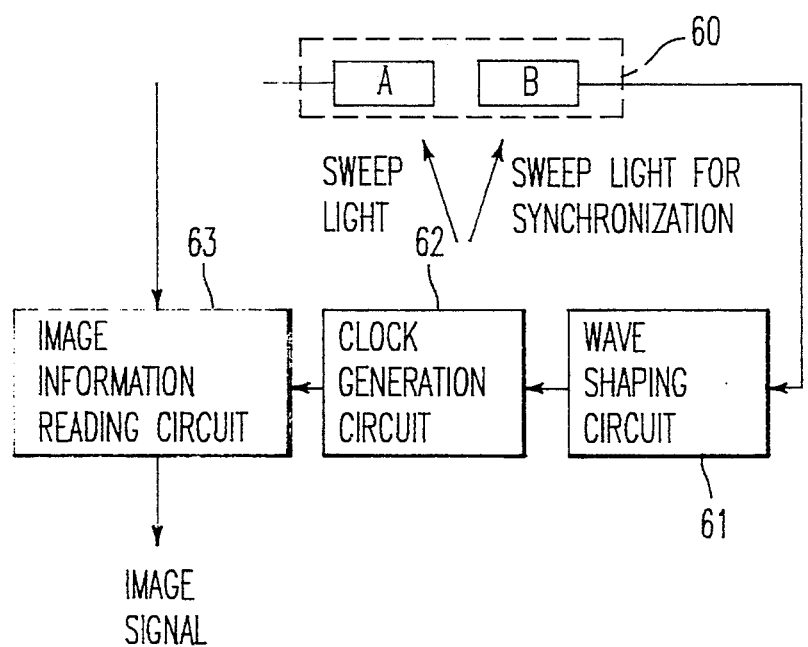
FIG. 11 is a view indicating the configuration of the circuit for reading the image information.

A description will now be given of a circuit for generating an image signal on the basis of the signals from the converting device, with reference to FIG. 11.

The converting device 60 has an element (A) for reading the optical image and an element (B) for generating the pulse signal for synchronization. When the sweep light scans the element (A) and when the sweep light for synchronization scans the element (B), the element (A) outputs the electrical signal corresponding to the optical image information and the element (B) outputs the pulse signal having a shape corresponding to the arrangement of the pixels. The pulse signal from the element (B) inputs to a wave shaping circuit 61. The wave shaping circuit 61 shapes the pulse signal into a signal having a predetermined wave form. The output signal from the wave shaping circuit 61 inputs to a clock generation circuit 62. The clock generation circuit 62 generates a clock signal with synchronization in the pulse signal. Then, the clock signal from the clock generation circuit 62 inputs to an image information reading circuit 63. The image information reading circuit 63 samples the signal output from the element (A) with synchronization in the clock signal and outputs the sampled signal successively as image signal.

In the embodiments as is shown in FIGS. 6 through 11, it is possible to select the period of the pulse signal for synchronization having the shape corresponding to the arrangement of the pixels so that it corresponds to either one or more pixels.

According to the embodiments as is shown in FIGS. 6 through 11, it is possible to read the image information for every pixels accurately.

Figure 12:
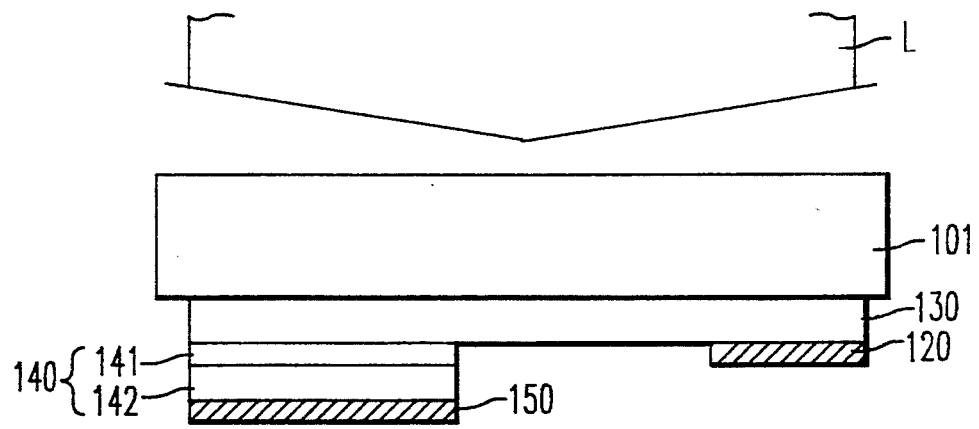
FIG. 12 is a view indicating an embodiment of an information storage element for converting optical image information storage element for converting optical image information into electrical signals, and according to the present invention.

FIG. 12 shows an embodiment of an information storage element. In FIG. 12, a substrate 101 has a light transmitting characteristic, that is, transparent. A photoelectric conversion layer 130 and a store and hold layer 140 are stacked as shown on a bottom surface of the substrate 101. An electrode 120 is formed on an exposed surface of the photoelectric conversion layer 130, and an electrode 150 is formed on an exposed surface of the store and hold layer 140. The electrodes 130 and 150 need not be transparent. In this specification, the term "transparent member" refers to a perfectly transparent member or a substantially transparent member with a light absorption which is negligible when a light having a predetermined wavelength is transmitted through the substantially transparent member when the usage of the light is considered.

The photoelectric conversion layer 130 is made of a photoelectric material such as amorphous silicon. The store and hold layer 140 has a stacked structure which is made up of insulating layers 141 and 142. For example, the insulating layer 141 is made of silicon dioxide ($Si_2O$) and is sufficiently thin so that a tunneling current flows, while the insulating layer 142 is made of silicon nitride (SiN) and has a thickness in the order of several hundreds of Å.

A light L is used for storing, reading or erasing information. This light L is irradiated on a top surface of the substrate 101 as shown. When scanning the information storage elements by the light L, the scan is made in a direction perpendicular to the paper in FIG. 12.

A width of the light L along the horizontal direction in FIG. 12 is set so that the light L can irradiate both the electrodes 120 and 150 at the same time.

In this case, a portion of the electrode 150 where the light L is irradiated substantially becomes a store and hold region. Accordingly, it is desirable to make an area of this portion large.

When a voltage is applied across the electrodes 120 and 150 and the light L is irradiated on the substrate 101, the impedance of the photoelectric conversion layer 130 becomes low. Consequently, an additional voltage is generated in the photoelectric conversion layer 130, and a field is generated in the store and hold layer 140 between the electrode 150 and the photoelectric conversion layer 130. This field can be used to store, read or erase the information.

Depending on the kind of layer and the layer structure of the photoelectric conversion layer 130, it is possible to provide the electrode 120 between the substrate 101 and the photoelectric conversion layer 130 as shown in FIG. 15A. In addition, it is possible to reduce the size of the electrode 150 compared to that of the store and hold layer 140 as shown in FIG. 15B in order to reduce a leak current which may be generated mainly at the side surfaces of the store and hold layer 140 when the light L is irradiating the substrate 101. Alternatively, it is possible to increase the size of the insulator layer 142 compared to that of the insulator layer 141 as shown in FIG. 15C. Of course, it is possible to combine the structures of FIGS. 15B and 15C.

In addition, shielding means 191 and 192 may be provided at the end portions on the top and bottom surfaces of the substrate 101 as shown in FIG. 15D for the purpose of preventing the photoelectric conversion at the end portions of the photoelectric conversion layer 130. Alternatively, it is possible to provide an insulator layer 180 at the side surfaces of the stacked structure on the substrate 101 as shown in FIG. 15E.

A portion of the photoelectric conversion layer 130 where no light L is irradiated has a high impedance. For this reason, an electrical capacitance between the electrodes 120 and 150 is small, and an electrical capacitance C of the element as a whole can be made small.

When this embodiment of the information storage element is compared with the information storage element proposed in a Japanese Laid-Open Patent Application No. 63-34797, this embodiment has the following advantageous features in addition to the small electrical capacitance C. In other words, this embodiment of the information storage element does not require a transparent electrode which has a low resistance and is technically difficult to form from the point of view of forming a uniform film. Therefore, this embodiment of the information storage element can be produced with ease.

Figure 13:
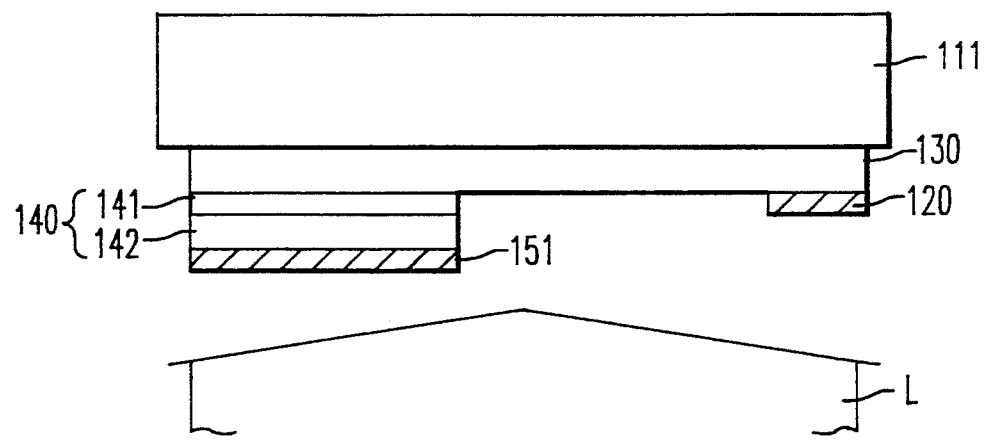
FIGS. 13 and 14 are views indicating another embodiment of an information storage element for converting optical image information into electrical signals, and according to the present invention.

FIG. 13 shows another embodiment of the information storage element. In FIG. 13, those parts which are essentially the same as those corresponding parts in FIG. 12 are designated by the same reference numerals.

In this embodiment, the photoelectric conversion layer 130 and the store and hold layer 140 are successively formed on the bottom surface of a substrate 111, similarly to the embodiment shown in FIG. 12. The electrode 120 is formed on the photoelectric conversion layer 130 and an electrode 151 is formed on the store and hold layer 140. The light L which is used for storing, reading or erasing information is irradiated from the bottom of the substrate 111, that is, from the side where the photoelectric conversion layer 130 and the store and hold layer 140 are provided. For this reason, the substrate 111 and the electrode 120 need not be transparent, but the electrode 151 must be transparent. Of course, the electrode 120 may be provided between the photoelectric conversion layer 130 and the substrate 111.

When scanning the information storage elements by the light L, the scan is made in a direction perpendicular to the paper in FIG. 13.

A width of the light L along the horizontal direction in FIG. 13 is set so that the light L can irradiate both the electrodes 120 and 151 at the same time. A portion of the electrode 151 where the light L is irradiated substantially becomes a store and hold region. Accordingly, it is desirable to make an area of this portion large.

The structures shown in FIGS. 15A through 15E are also effective in this embodiment when preventing the leak current from the side surfaces of the store and hold layer 140 and when preventing the photoelectric conversion at the end portions of the photoelectric conversion layer 130.

In this embodiment, it is also possible to reduce the electrical capacitance C between the electrodes 120 and 151. In addition, the material of the substrate 111 may be selected with a larger degree of freedom when compared to the embodiment shown in FIG. 12 because the substrate 111 need not be transparent.

Figure 14:
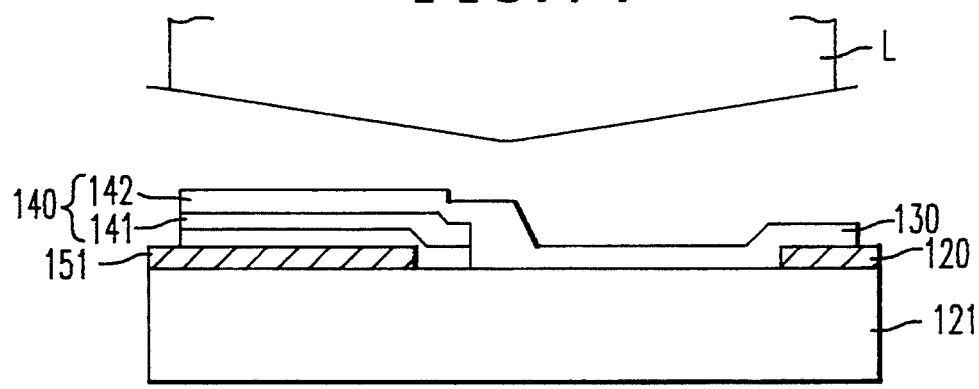

FIG. 14 shows still another embodiment of the information storage element. In FIG. 14, those parts which are essentially the same as those corresponding parts in FIGS. 12 and 13 are designated by the same reference numerals.

In this embodiment, an electrode 121 and the electrode 151 are formed on the top surface of the substrate 111 at mutually isolated positions. The store and hold layer 140 is formed on the electrode 151. The photoelectric conversion layer 130 is formed on the store and hold layer 140 and the electrode 121.

The light L which is used for storing, reading or erasing information is irradiated from the top of the substrate 111, that is, from the side where the photoelectric conversion layer 130 is provided. For this reason, the substrate 111 and the electrodes 121 and 151 need not be transparent.

When scanning the information storage elements by the light L, the scan is made in a direction perpendicular to the paper in FIG. 14.

A width of the light L along the horizontal direction in FIG. 14 is set so that the light L can irradiate both the electrodes 121 and 151 at the same time. A portion of the electrode 151 where the light L is irradiated substantially becomes a store and hold region. Accordingly, it is desirable to make an area of this portion large.

The structures shown in FIGS. 15A through 15E are also effective in this embodiment when preventing the leak current from the side surfaces of the store and hold layer 140 and when preventing the photoelectric conversion at the end portions of the photoelectric conversion layer 130.

In this embodiment, it is also possible to reduce the electrical capacitance C between the electrodes 121 and 151. In addition, the materials used for the substrate 111 and the electrodes 121 and 151 may be selected with a larger degree of freedom when compared to the embodiments shown in FIGS. 12 and 13 because the substrate 111 and the electrodes 121 and 151 need not be transparent.

In this embodiments shown in FIGS. 12, 13 and 14, any of the photoelectric conversion layers and the store and hold layers disclosed in a Japanese Laid-Open Patent Application No. 63-34797 may be used for the corresponding photoelectric conversion layer 130 and the corresponding store and hold layer 140.

In addition, the layer structures of the photoelectric conversion structures employed in any of the photoconductors and photocapacitors disclosed in a Japanese Laid-Open Patent Application No. 62-139481 may be applied to the photoelectric conversion layer and the store and hold layer of the embodiments shown in FIGS. 12 through 14. In this case, depending on the combination of the layer structures used and whether the store, read or erase function is to be realized, the layer structure used may function as the photoelectric conversion layer and/or the store and hold layer. In addition, the storage to the reading of the information can be made in a short time, in the order of few milliseconds. The erasure of the stored information content is carried out over a period of time or by storing a new information over the stored information.

Accordingly, modifications of the embodiments shown in FIGS. 12 through 14 may be made by replacing the photoelectric conversion layer and the store and hold layer by the above described photoelectric conversion structures.

The embodiments of the information storage elements shown in FIGS. 12 through 14 are one-dimensional. Hence, when making a store, read or erase operation on the information storage element, the optical image is irradiated one-dimensionally in the direction perpendicular to the paper in FIGS. 12 through 14 or a light beam scans the information storage element. But of course, a plurality of information storage elements may be arranged two-dimensionally in the horizontally direction in FIGS. 12 through 14 and make the information storage, reading or erasure by scanning the information storage elements by a light beam which makes a two-dimensional scan.

A storage method proposed in the Japanese Laid-Open Patent Application No. 63-34794 can basically be applied to store the information in the information storage elements shown in FIGS. 12 through 14. In the case of the information storage element shown in FIG. 12, for example, a light beam which is modulated depending on the information which is to be stored scans the information storage element while applying a predetermined voltage across the electrodes 120 and 150, so as to accumulate a charge in a portion of the store and hold layer 140 corresponding to a portion of the photoelectric conversion layer 130 where the photoelectric conversion takes place. The information is stored in the information storage element depending on the existence of the charge or the charge in the charge in the store and hold layer 140.

For this reason, when storing a new information into the information storage element which already stores an information, it is necessary to first carry out an erase operation to eliminate the charge accumulated in the store and hold layer so as to return the information storage element to an initial state where no charge is accumulated in the store and hold layer.

The Japanese Laid-Open Patent Application No. 63-34794 proposes another storage method in which a light beam having a constant light intensity scans the information storage element. In this case, the voltage which is applied across the two electrodes has an amplitude which is modulated depending on the information which is to be stored. However, this storage method does not solve the above described problem.

Hence, in another embodiment of the present invention, the polarity of the voltage which is applied across the two electrodes is switched (modulated) depending on the information which is to be stored while scanning the information storage element by a light beam which has a predetermined light intensity, when the information which is to be stored is a binary information "0" or "1".

Figure 16:
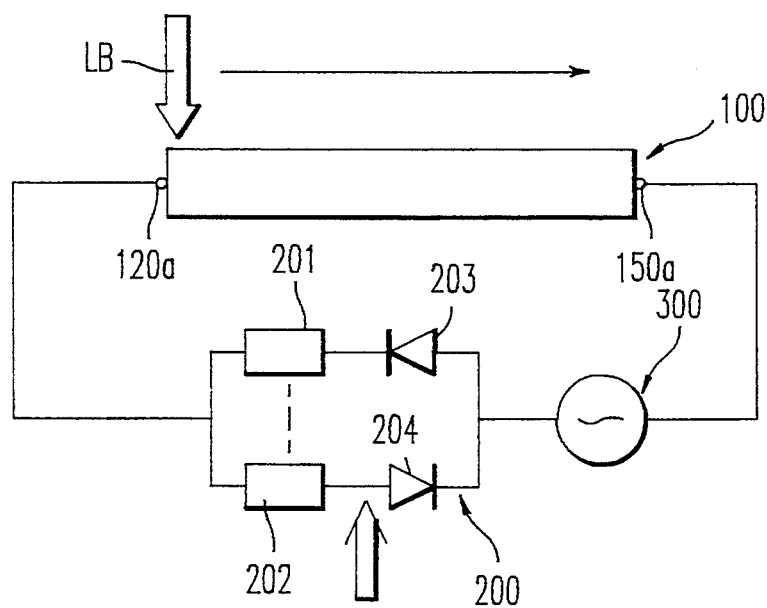
FIG. 16 is a view indicating a circuit for storing binary information in an information storage element.

FIG. 16 shows this other embodiment. An information storage element 100 has a structure which is shown in any of FIGS. 12 through 14. An electrode 120a makes contact with the photoelectric conversion element of the information storage element 100 and an electrode 150a makes contact with the store and hold layer of the information storage element 100. An A.C. voltage from an A.C. power source 300 is applied across the electrodes 120a and 150a via a polarity modulation circuit 200. A binary information signal is applied to the polarity modulation circuit 200 while a light beam LB having a predetermined light intensity scans the information storage element 100. The polarity modulation circuit 200 comprises a first circuit made up of a switch 201 and a diode 203, and a second circuit made up of a switch 202 and a diode 204. The ON/OFF state of the switches 201 and 202 are switched depending on whether the binary information signal is "0" or "1".

The polarity of the voltage which is applied across the electrodes 120a and 150a is inverted depending on whether the binary information signal is "0" or "1". Because the portion of the photoelectric conversion layer irradiated by the light beam LB has a low impedance, a charge is injected into the store and hold layer which is in contact with this portion of the photoelectric conversion layer. The existence and non-existence of the accumulated charge in the store and hold layer, or the polarity of the accumulated charge in the store and hold layer, is determined by the value of the binary information signal.

The state of the accumulated charge in the store and hold layer is forcibly determined depending on the polarity of the applied voltage, independently of the state of the information storage element 100 up to that time. Accordingly, it is possible to make the so-called over-writing of information. When the effects of the electrical capacitance C on the response of the information storage element 100 is disregarded, this storage method can be applied to all of the information storage elements of the type disclosed in the Japanese Laid-Open Patent Application No. 63-34794.

According to these embodiments described in conjunction with FIGS. 12 through 16, the electrical capacitance is small at parts of the information storage element other than the part where the storage or reading of the information is made when making a time-sequential information storage or read operation. As a result, the information can be stored and read at a high speed. In addition, it is possible to carry out the so-called over-writing such that a circuit for erasing the stored information content can be omitted. Therefore, the number of fields to which the information storage element of the present invention may be applied is greatly enlarged. Moreover, the process of storing a new information can be carried out at a high speed since there is no need to erase the stored information prior to the storage of the new information.

Further, the present invention is not limited to these embodiments, but various variations and modifications may be made without departing from the scope of the present invention.

What is claimed is:

1. An apparatus for converting optical information into an electrical information signal, comprising:
    a first photoelectric conversion structure having a plurality of photoelectric conversion elements which are actually arranged into a line or matrix or configured so as to be substantially equivalent to an arrangement in which said plurality of photoelectric conversion elements are arranged in a line or matrix, each of said plurality of photoelectric conversion elements having a light receiving surface onto which information light is projected;
    a second photoelectric conversion structure having a plurality of photoelectric conversion elements which are actually arranged into a line or matrix or configured so as to be substantially equivalent to an arrangement in which said plurality of photoelectric conversion elements are arranged into a line or matrix, each of said plurality of photoelectric conversion elements having a scanning sweep light receiving surface onto which said scanning sweep light is projected, and each of said plurality of photoelectric conversion elements electrically coupled to a corresponding one of said plurality of photoelectric conversion elements of said first photoelectric conversion structure; and
    a third photoelectric conversion structure having a plurality of photoelectric conversion elements which are actually arranged into a line or matrix or configured so as to be substantially equivalent to an arrangement in which said plurality of photoelectric conversion elements are arranged into a line or matrix, each of said plurality of photoelectric conversion elements having a synchronizing sweep light receiving surface onto which said synchronizing sweep light is projected, said synchronizing sweep light being in synchronism with said scanning sweep light, an electrical synchronizing signal being generated by said third photoelectric conversion structure,
    said electrical information signal being read out from said plurality of photoelectric conversion elements provided in said first photoelectric conversion structure together with said electrical synchronizing signal when said sweep light is projected onto said plurality of photoelectric conversion elements provided in said second photoelectric conversion structure.

2. An apparatus as claimed in claim 1, wherein said first photoelectric conversion structure is formed on said second photoelectric conversion structure, and said third photoelectric conversion structure is located on a side of said second photoelectric conversion structure and spaced apart therefrom.

3. An apparatus as claimed in claim 2, wherein said second photoelectric conversion structure has a layer in common with said third photoelectric conversion structure.

4. An apparatus as claimed in claim 2, further comprising a shading layer which is formed on a part of said first photoelectric conversion structure and the entire third photoelectric conversion structure so that said information light is prevented from being projected onto said third photoelectric conversion structure.

5. An apparatus as claimed in claim 2, wherein said second photoelectric conversion structure comprises a first semiconductor layer, a second semiconductor layer and a photoelectric layer sandwiched between said first and second semiconductor layers, wherein said first and second semiconductor layers and said photoelectric layer are provided in common to said third photoelectric conversion structure.

6. An apparatus as claimed in claim 2, wherein said second photoelectric conversion structure comprises a first semiconductor layer, a second semiconductor layer and a photoelectric layer sandwiched between said first and second semiconductor layers, wherein said photoelectric layer is provided in common to said third photoelectric conversion structure.

7. An apparatus as claimed in claim 6, further comprising a shading layer formed on a portion of said photoelectric layer included in said third photoelectric conversion structure so that said information light is prevented from being projected onto said portion of the photoelectric layer.

8. An apparatus as claimed in claim 2, further comprising an isolating layer which is provided between said second and third photoelectric conversion structures and isolates said second photoelectric conversion structure from said third photoelectric conversion structure.

9. An apparatus as claimed in claim 8, wherein said second photoelectric conversion structure has a layer commonly owned by said third photoelectric conversion structure, and said isolating layer is formed in said layer.

10. An apparatus as claimed in claim 1, wherein said third photoelectric conversion structure has light receiving windows or slits which are periodically spaced.

11. An apparatus as claimed in claim 1, wherein said information light travels in a first direction opposite to a second direction in which said scanning sweep light and said synchronizing sweep light travel.

12. An apparatus as claimed in claim 1, wherein said information light travels in a first direction in which said synchronizing sweep light travels, and said scanning sweep light travels in a second direction opposite to said first direction.

13. An apparatus as claimed in claim 1, wherein said scanning sweep light is the same as said synchronizing sweep light.

14. An apparatus for converting optical information into an electrical information signal, comprising:
a first photoelectric conversion structure having a plurality of photoelectric conversion elements which are actually arranged into a line or matrix or configured so as to be substantially equivalent to an arrangement in which said plurality of photoelectric conversion elements are arranged into a line or matrix, each of said plurality of photoelectric conversion elements having a light receiving surface onto which information light is projected;

a second photoelectric conversion structure having a plurality of photoelectric conversion elements which are actually arranged into a line or matrix or configured so as to be substantially equivalent to an arrangement in which said plurality of photoelectric conversion elements are arranged into a line or matrix, each of said plurality of photoelectric conversion elements having a scanning sweep light receiving surface onto which said scanning sweep light is projected, and each of said plurality of photoelectric conversion elements electrically coupled to a corresponding one of said plurality of photoelectric conversion elements of said first photoelectric conversion structure;

a third photoelectric conversion structure having a plurality of photoelectric conversion elements which are actually arranged into a line or matrix or configured so as to be substantially equivalent to an arrangement in which said plurality of photoelectric conversion elements are arranged into a line or matrix, each of said plurality of photoelectric conversion elements having a synchronizing sweep light receiving surface onto which said synchronizing sweep light is projected, said synchronizing sweep light being in synchronism with said scanning sweep light, an electrical synchronizing signal being generated by said third photoelectric conversion structure;

light source generating means for generating said scanning sweep light and said synchronizing sweep light; and signal processing means for receiving said electrical information signal and said electrical synchronizing signal and for converting said electrical information signal into an image signal which is in synchronism with said electrical synchronizing signal from said third photoelectric conversion structure.

15. An apparatus as claimed in claim 14, wherein said signal processing means comprises:
waveform shaping means for shaping a waveform of said electrical synchronizing signal and for outputting a waveform-shaped electrical synchronizing signal;

clock signal generating means for generating a clock signal having a predetermined pulse width and being in synchronism with said waveform-shaped electrical synchronizing signal; and converting means for converting said electrical information signal into said image signal which is in synchronism with said clock signal supplied from said clock signal generating means.

16. An apparatus as claimed in claim 14, wherein said light source generating means generates a light, which is partially projected, as said scanning sweep light, onto said scanning sweep light receiving surface of said second photoelectric conversion structure and is partially projected, as said synchronizing sweep light, onto said synchronizing sweep light receiving surface of said third photoelectric conversion structure.

17. An information storage element comprising:
a first layer;
a second layer formed to contact the first layer, one of said first and second layers being a photoelectric conversion layer, the other being an information storage layer in which optical information irradiated onto said photoelectric conversion layer is converted into electrical information and stored therein;

a first electrode formed on said first layer; and a second electrode formed on said second layer at a position so that said second electrode does not overlap said first electrode.

18. An information storage element as claimed in claim 17, wherein the polarity of a voltage applied across said first and second electrodes is switched between a positive polarity and a negative polarity in accordance with binary information to be written into said information storage layer in a state in which said photoelectric conversion layer is being scanned.

* * * * *